(12) United States Patent
Braun

(10) Patent No.: US 10,171,087 B1
(45) Date of Patent: Jan. 1, 2019

(54) LARGE FAN-IN RQL GATES

(71) Applicant: Alexander Louis Braun, Baltimore, MD (US)

(72) Inventor: Alexander Louis Braun, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/810,907

(22) Filed: Nov. 13, 2017

(51) Int. Cl.
  *H03K 19/195* (2006.01)
  *H03K 3/38* (2006.01)
  *G11C 11/44* (2006.01)

(52) U.S. Cl.
  CPC ............ *H03K 19/195* (2013.01); *G11C 11/44* (2013.01); *H03K 3/38* (2013.01)

(58) Field of Classification Search
  CPC ......... H03K 19/195; H03K 3/38; G11C 11/44
  USPC ............................................................ 326/3
  See application file for complete search history.

(56) References Cited

U.S. PATENT DOCUMENTS

| | | | |
|---|---|---|---|
| 3,094,685 A | 6/1963 | Crowe | |
| 4,956,642 A | 9/1990 | Harada | |
| 5,233,243 A * | 8/1993 | Murphy | H03K 19/1954 326/4 |
| 6,310,488 B1 | 10/2001 | Hasegawa et al. | |
| 6,608,518 B2 | 8/2003 | Furuta et al. | |
| 6,734,699 B1 * | 5/2004 | Herr | H03K 19/1952 326/1 |
| 6,756,925 B1 | 6/2004 | Leung et al. | |
| 7,129,869 B2 | 10/2006 | Furuta et al. | |
| 7,227,480 B2 | 6/2007 | Furuta et al. | |
| 7,724,020 B2 | 5/2010 | Herr | |
| 7,786,748 B1 | 8/2010 | Herr | |
| 7,903,456 B2 | 3/2011 | Kirichenko et al. | |
| 7,944,253 B1 | 5/2011 | Kirichenko | |
| 7,969,178 B2 | 6/2011 | Przybysz et al. | |
| 7,977,964 B2 | 7/2011 | Herr | |
| 8,138,784 B2 | 3/2012 | Przybysz et al. | |
| 8,489,163 B2 | 7/2013 | Herr et al. | |
| 8,611,974 B2 | 12/2013 | Maibaum et al. | |
| 9,455,707 B2 | 9/2016 | Herr et al. | |
| 9,543,959 B1 | 1/2017 | Carmean et al. | |
| 9,595,970 B1 | 3/2017 | Reohr et al. | |
| 9,646,682 B1 | 5/2017 | Miller et al. | |
| 9,712,172 B2 | 7/2017 | Shauck et al. | |
| 9,780,765 B2 | 10/2017 | Naaman et al. | |

(Continued)

OTHER PUBLICATIONS

Office Action corresponding to U.S. Appl. No. 15/886,652, dated May 24, 2018.

(Continued)

*Primary Examiner* — Don Le
(74) *Attorney, Agent, or Firm* — Tarolli, Sundheim, Covell & Tummino LLP

(57) ABSTRACT

Large fan-in logical gate circuits for use in reciprocal quantum logic (RQL) systems and related methods permit for improved efficiency and density of RQL logic. A majority 3-of-5 gate circuit, as described, can be extended to include more than five inputs, and can also be modified to create AND gates, OR gates, and OA gates. The gate circuits can accommodate inputs and provide outputs each in the form of single flux quantum (SFQ) pulses, either positive or negative, to indicate asserted and de-asserted logic states, respectively.

20 Claims, 14 Drawing Sheets

(56) References Cited

U.S. PATENT DOCUMENTS

| | | |
|---|---|---|
| 9,812,192 B1 | 11/2017 | Burnett et al. |
| 9,876,505 B1 | 1/2018 | Dai et al. |
| 9,887,700 B2 | 2/2018 | Carmean et al. |
| 9,905,900 B2 | 2/2018 | Herr et al. |
| 9,917,580 B2 | 3/2018 | Naaman |
| 9,972,380 B2 | 5/2018 | Ambrose |
| 2003/0011398 A1 | 1/2003 | Herr |
| 2003/0016069 A1 | 1/2003 | Furuta et al. |
| 2009/0153180 A1* | 6/2009 | Herr ..................... B82Y 10/00 326/4 |
| 2011/0133770 A1 | 6/2011 | Przybysz et al. |
| 2016/0164505 A1* | 6/2016 | Naaman ................ H03K 3/38 327/528 |
| 2017/0359072 A1* | 12/2017 | Hamilton ............... H03K 19/21 |

OTHER PUBLICATIONS

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

\* cited by examiner

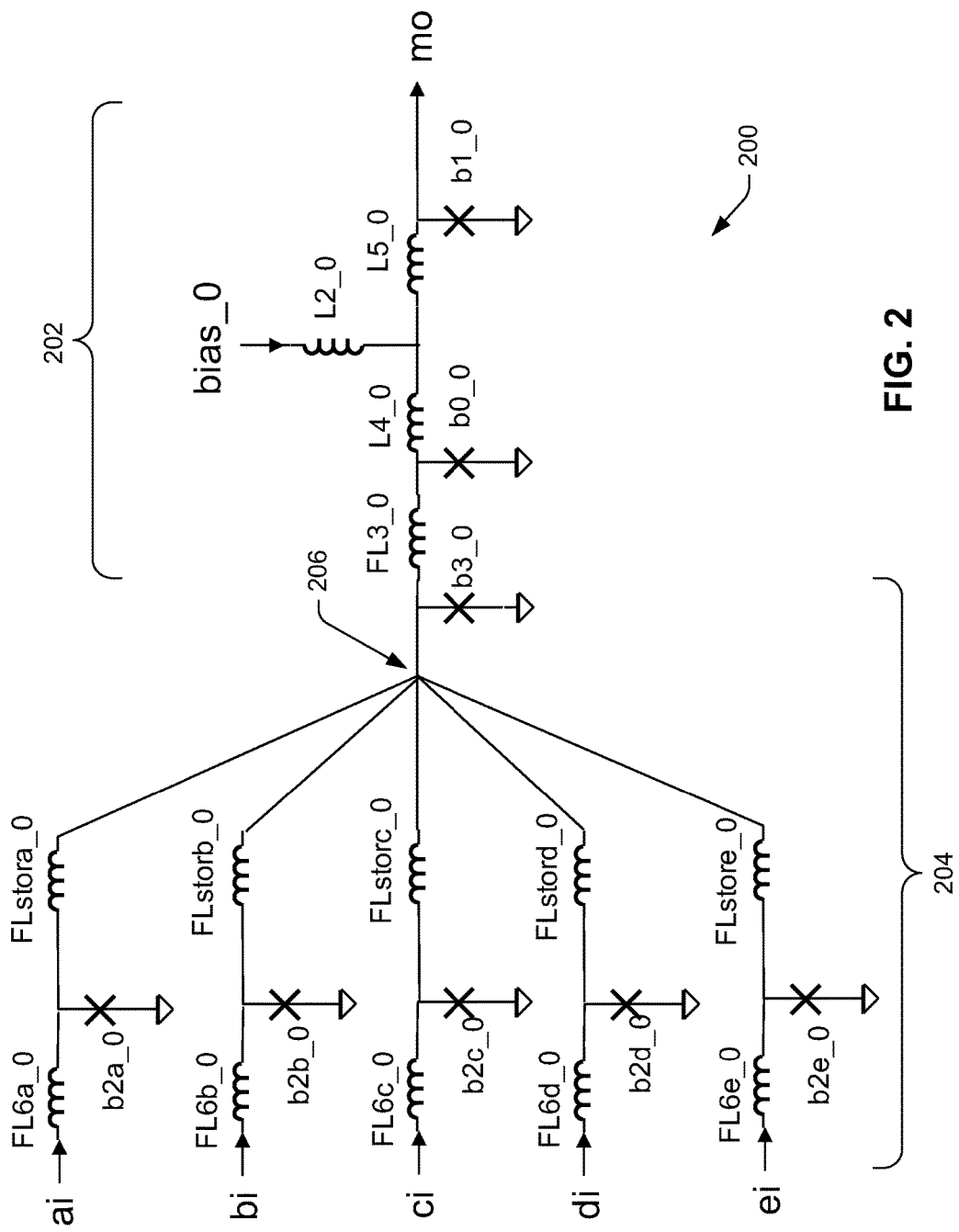

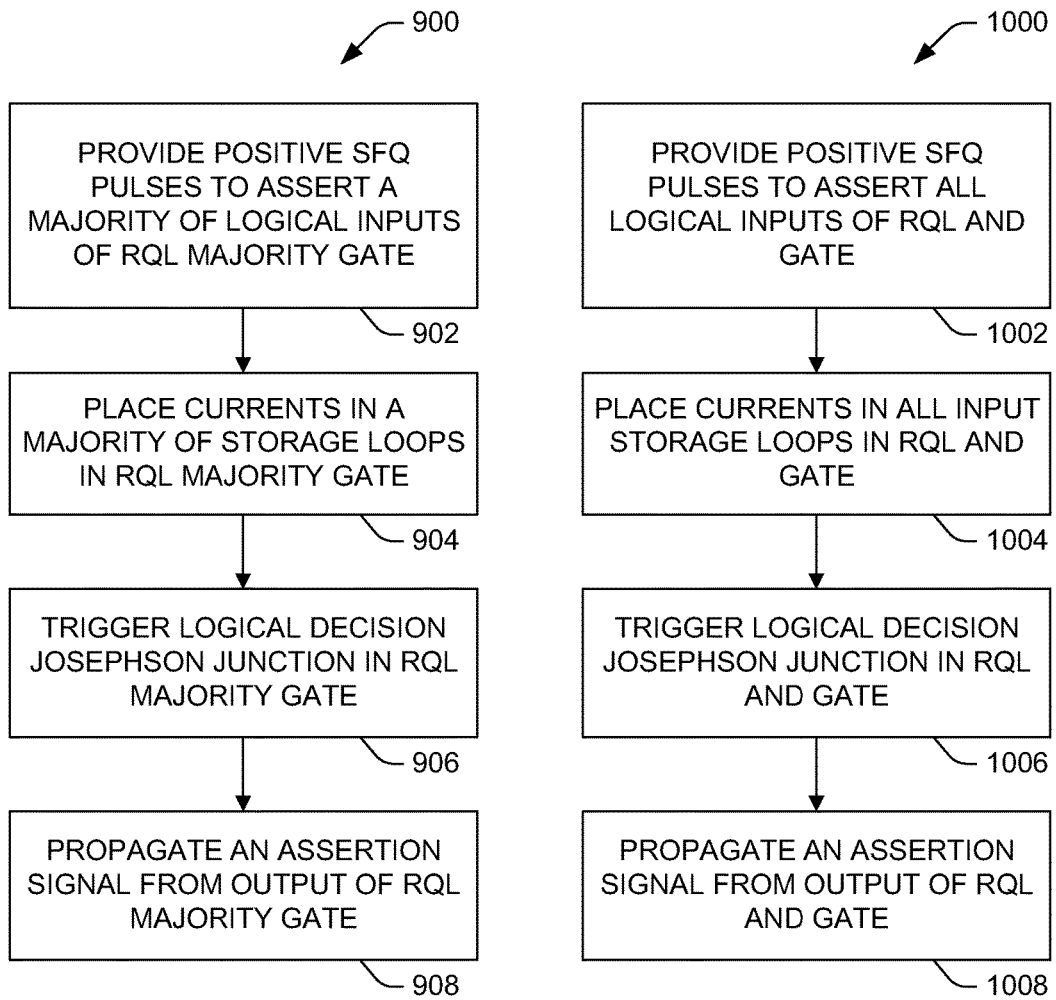

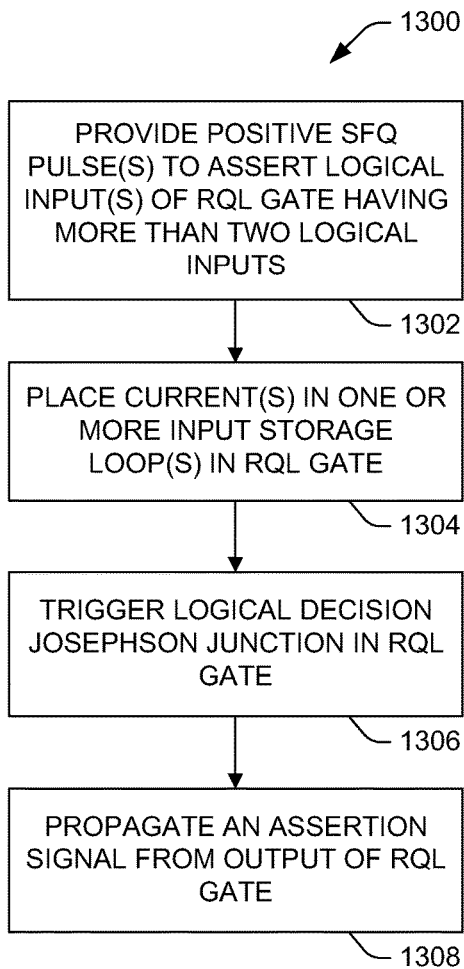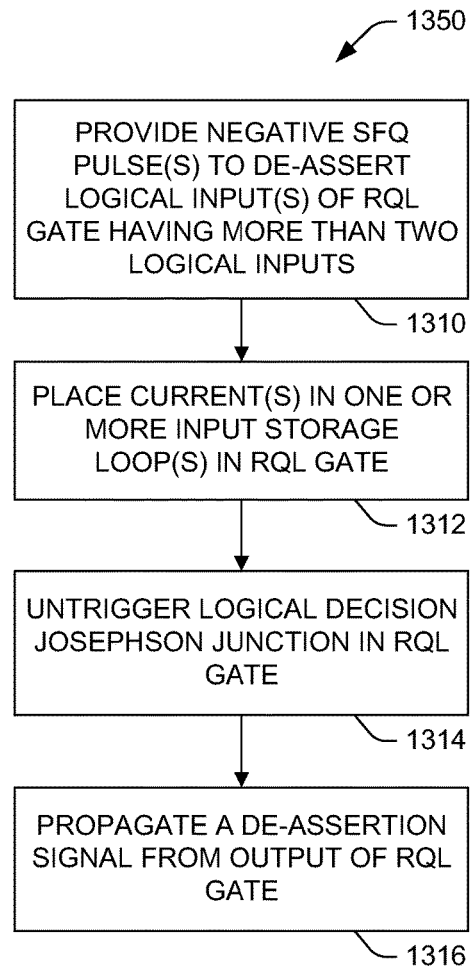
FIG. 13A  FIG. 13B

US 10,171,087 B1

LARGE FAN-IN RQL GATES

TECHNICAL FIELD

The present invention relates generally to quantum and classical digital superconducting circuits, and specifically to large fan-in reciprocal quantum logic (RQL) gates.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

"Fan-in" describes the number of inputs a logic gate can handle. The larger the fan-in, the more inputs can be handled by the gate. Logic gates with higher fan-in can be employed in digital logic design to reduce the depth of a logic circuit, improving circuit efficiency and density. A majority gate is a logical gate that returns true if and only if more than 50% of its inputs are true.

SUMMARY

One example includes a reciprocal quantum logic (RQL) gate circuit. The RQL gate circuit has an input stage having more than two logical inputs each configured to be asserted based on receiving a positive single flux quantum (SFQ) pulse. The input stage has, for each logical input, at least one storage loop associated with the logical input. Each storage loop includes at one input Josephson junction (JJ), at least one inductor, and a logical decision JJ. The logical decision JJ is common to all the storage loops associated with the logical inputs. The RQL gate further has an output stage configured to assert an output based on a triggering of the logical decision JJ in response to a combination of logical inputs. It can also de-assert an output based on an untriggering of the logical decision JJ in response to a different combination of logical inputs.

Another example includes a method of determining a logic value, based on logical inputs. One or more positive SFQ pulses are provided to assert one or more logical inputs of an RQL gate having more than two logical inputs. One or more positive currents are thereby placed in one or more input storage loops in the RQL gate, which has at least one storage loop per logical input. A logical decision JJ in the RQL gate is thereby triggered in response to a combination of logical inputs. An assertion signal is thereby propagated from an output of the RQL gate.

Another example includes a circuit having more than two logical input Josephson transmission lines (JTLs) that intersect at a dovetail node. Each logical input JTL includes a storage loop input inductor connected, at a first node, to an input JJ and a storage inductor. The storage loop input inductor, input JJ, and storage inductor are sized with respect to one another to provide unidirectional data flow. A logical decision JJ is connected between the dovetail node and a low-voltage node, such that respective storage loops are formed by the input JJ and storage inductor of each input JTL and the logical decision JJ. An output JTL between the dovetail node and a logical output node provides an asserted or de-asserted logical output signal at the output node based on asserted or de-asserted logical input signals provided to the logical input JTLs.

BRIEF DESCRIPTION OF THE DRAWINGS

FIG. 2 is a circuit diagram of an example 3-of-5 majority gate.

FIG. 9 is a flow diagram of an example method of determining a logical OR value based on SFQ pulse inputs.

FIG. 10 is a flow diagram of an example method of determining a logical AND value based on SFQ pulse inputs.

FIGS. 13A and 13B are flow diagrams of example methods of determining a logical output from an RQL gate having more than two inputs based on SFQ pulse inputs.

DETAILED DESCRIPTION

This disclosure relates generally to logical gate circuits for use in reciprocal quantum logic (RQL) systems and related methods. This disclosure more specifically relates to such gates having more than two inputs (in some examples many more than two), including majority gates, AND gates, OR gates, and OR-AND (OA) gates.

Figure 1:
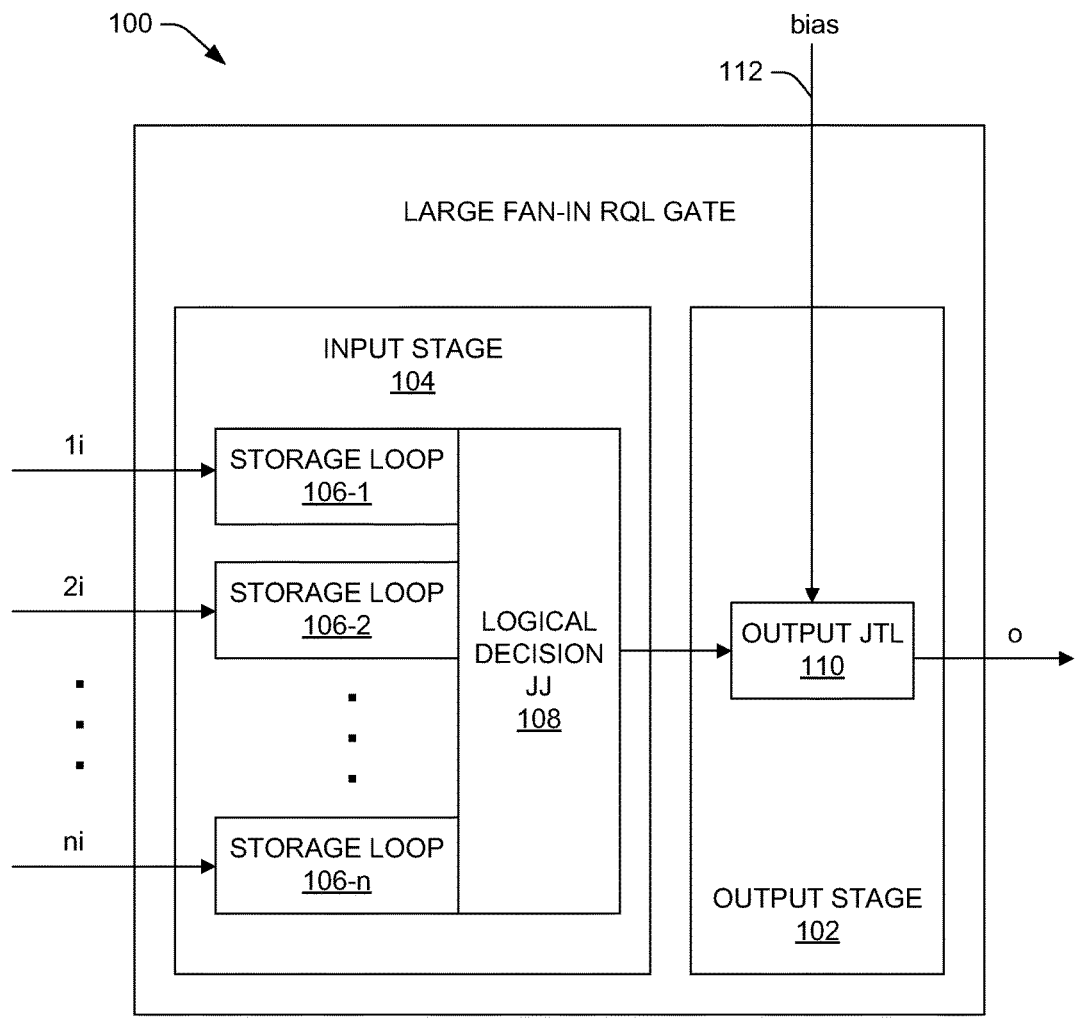
FIG. 1 is a block diagram of an example large fan-in reciprocal quantum logic (RQL) gate.

FIG. 1 shows large fan-in RQL gate 100 having a number, greater than two, of logical inputs 1$i$ through n$i$, and output o. Gate 100 includes output stage 102, configured to provide output o, and input stage 104, configured to receive inputs 1$i$ through n$i$, which can consist of positive or negative single flux quantum (SFQ) pulses corresponding to asserted or de-asserted logic states, respectively. Each input has associated with it at least one storage loop among storage loops 106-1 through 106-$n$. Although input stage 104 is illustrated as having one storage loop per input, each input can have more than one storage loop associated with it. Logical decision Josephson junction (JJ) 108 is common to (i.e., shared by) all logical input storage loops, and triggers based on inputs 1$i$ through n$i$. The assertion or de-assertion of output o is based on the triggering of logical decision JJ 108. For example, output o can propagate a positive SFQ pulse corresponding to an asserted output logic state and a negative SFQ pulse corresponding to a de-asserted output logic state. Output stage 102 can include an output Josephson transmission line (JTL) to amplify the output of logical decision JJ 108.

The triggering of logical decision JJ 108 can be based not only on inputs 1$i$ through n$i$, but also on a bias signal 112 provided to output stage 102, e.g., to output JTL 110. Bias signal 112 can provide both AC and DC bias. Thus, for example, bias signal 112 can act as a clock to RQL gate 100, causing the evaluation of the inputs 1i through ni to produce the output o at certain points in time according to the AC component of bias signal 112.

FIG. 2 illustrates an RQL gate that can have a number of configurations to provide a number of different logical functions. Specifically, the illustrated configuration 200 provides a 3-of-5 majority gate having an output Josephson transmission line (JTL) stage 202 to provide amplification and an input stage 204 having a number of JTL input branches that join at dovetail node 206. Together with logical decision JJ b3_0, the input branches form storage loops to receive and store inputs until a logical decision can be made, i.e., until a logic condition is met. Output JTL stage 202 includes JJs b0_0 and b1_0 along with inductor FL3_0, L4_0, and L5_0 and an AC and DC bias bias_0. In input stage 204, a separate input storage loop is associated with each input. The input storage loop for input ai includes JJs b2a_0 and b3_0, as well as inductor FLstora_0. Leading inductor FL6a_0 allows input ai to be connected to a driving JTL or to the output of another gate.

The selections of component sizes in this storage loop provide a unidirectional data flow. Circuit 200 operates on SFQ pulses, which each place one $\Phi_0$ (about 2.07 mA pH) of current into a storage loop. The magnitude of current through such a storage loop is determined by the size of the storage inductor in the storage loop. Thus, for each input, the inductance value of the storage loop input inductor (e.g., FL6a_0) can be small (e.g., between about 8 pH and 9 pH, e.g., 8.5 pH) in comparison to the inductance value of the storage inductor (e.g., FLstora_0). On the other hand, the storage inductor can sized to be relatively large (e.g., between about 30 pH and 40 pH, e.g., 35 pH) (e.g., about four times larger than the corresponding storage loop input inductor) to reduce the magnitude of the stored current induced by an input SFQ pulse. In some examples, the magnitude of a current introduced at an input (e.g., ai) is about four times larger than the current stored in a storage loop. The input JJ for input ai, b2a_0, is also sized such that the driving JTL is capable of flipping this JJ to put current into the storage loop, but the current in the storage loop is never sufficient to unflip input JJ b2a_0 and allow the stored pulse to back out of the input.

The storage loops associated with inputs bi, ci, di, and ei can have the same structure as the storage loop for input ai, all overlapping at logical decision JJ b3_0. Output mo may also be connected to a JTL or to the input of another gate, for example, to propagate a positive output pulse representing the assertion of gate 200 to logical "high." A subsequent negative output pulse propagated from output mo can then represent the de-assertion of gate 200 to logical "low."

Logical decision JJ b3_0 performs the logic function of the gate 200. The combination of any three inputs, plus the bias bias_0, is sufficient to switch logical decision JJ b3_0 in either direction. In circuit 200, no bias is applied directly to logical decision JJ b3_0, but a small amount may reach logical decision JJ b3_0 from both the bias of the output JTL and from the input JTLs. As mentioned with respect to bias signal 112 in gate 100 of FIG. 1, an AC component (e.g., a sine wave component) of bias signal bias_0 in gate 200 of FIG. 2 can act as a clock signal to gate 200, which can evaluate the logical inputs twice per cycle of the clock signal. The AC phase of bias signal bias_0 can have alternating positive and negative portions. During the positive portion of the AC phase, gate 200 evaluates inputs ai through ei to decide whether output mo should be asserted; during the negative portion of the AC phase, gate 200 evaluates inputs ai through ei to decide whether output mo should be de-asserted.

Figure 3A:
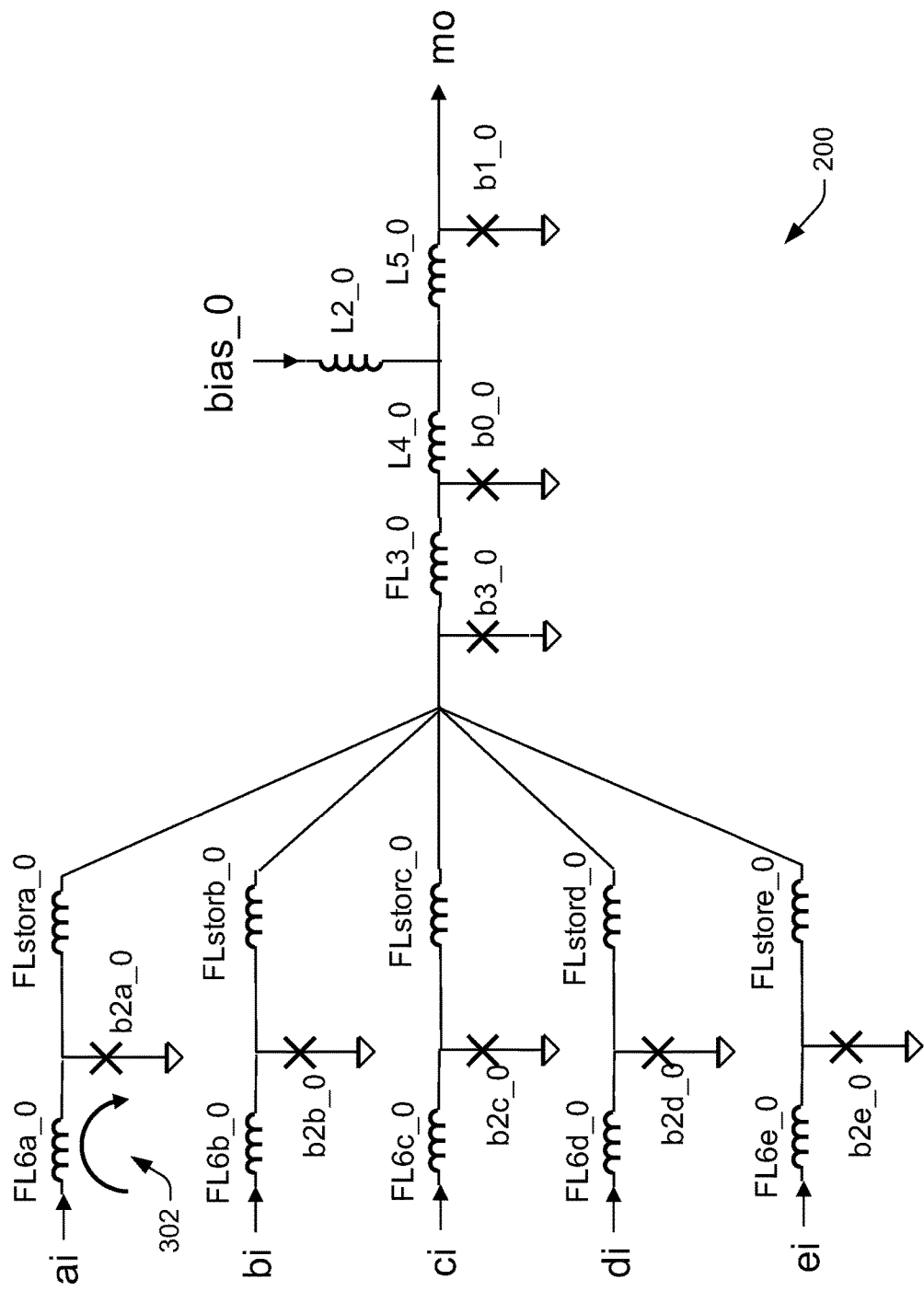
FIGS. 3A and 3B illustrate an example single-input assertion sequence in the gate of FIG. 2.
Figure 3B:
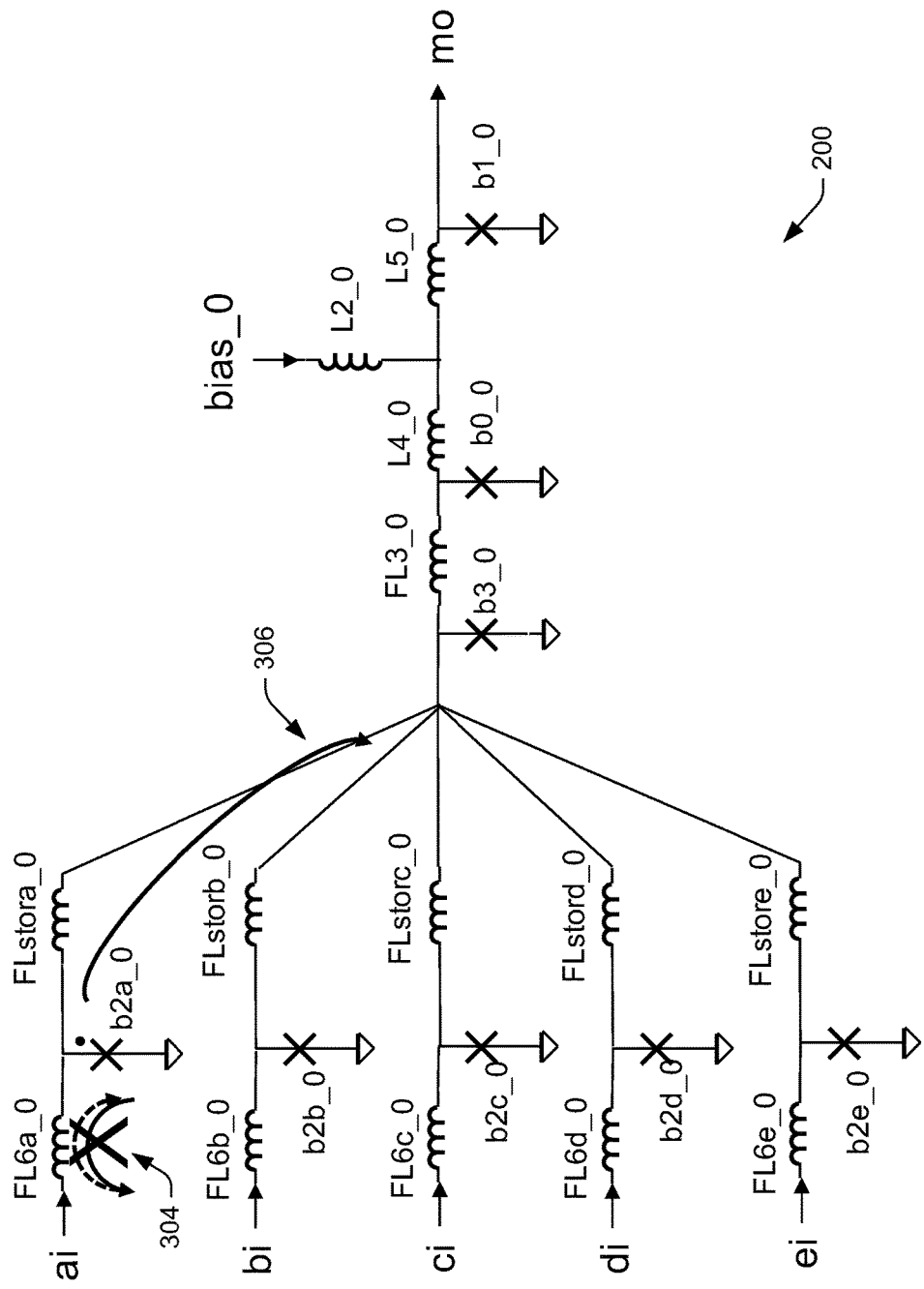

FIGS. 3A and 3B illustrate the sequence of events in gate circuit 200 when a single input is asserted. In FIG. 3A, an input pulse, e.g., a single flux quantum (SFQ) pulse, arrives at input ai. This induces superconducting current 302 through leading inductor FL6a_0 and input JJ b2a_0. Current 302 in turn triggers input JJ b2a_0, raising its superconducting phase to $2\pi$, as indicated by the dot above input JJ b2a_0 in FIG. 3B. As shown in FIG. 3B, the triggering of input JJ b2a_0 induces an equal and opposite current (e.g., one $\Phi_0$ worth of current) in leading inductor FL6a_0, annihilating 304 the initial input current, and also induces superconducting current 306 in the loop formed by input JJ b2a_0, input loop storage inductor FLstora_0, and logical decision JJ b3_0. Current 306 alone is insufficient to trigger logical decision JJ b3_0, and will remain trapped indefinitely if no further inputs are applied. A negative input pulse arriving at input ai would reverse the above-described effects, annihilating current 306 and returning the circuit to its initial state. Inputs bi, ci, di, and ei operate in exactly the same manner, as they are perfectly symmetrical with input ai.

Current 306 alone is insufficient to trigger logical decision JJ b3_0, even with the AC and DC bias bias_0, not only because b3_0 may be a larger JJ than the JJs preceding it in circuit 200, but also because of the majority structure of circuit 200. The additional load presented to logical decision JJ b3_0 by the components associated with unasserted inputs bi through ei inhibits logical decision JJ b3_0 from triggering. Thus, assertion of a majority of inputs are required to cause b3_0 to trigger.

Figure 4A:
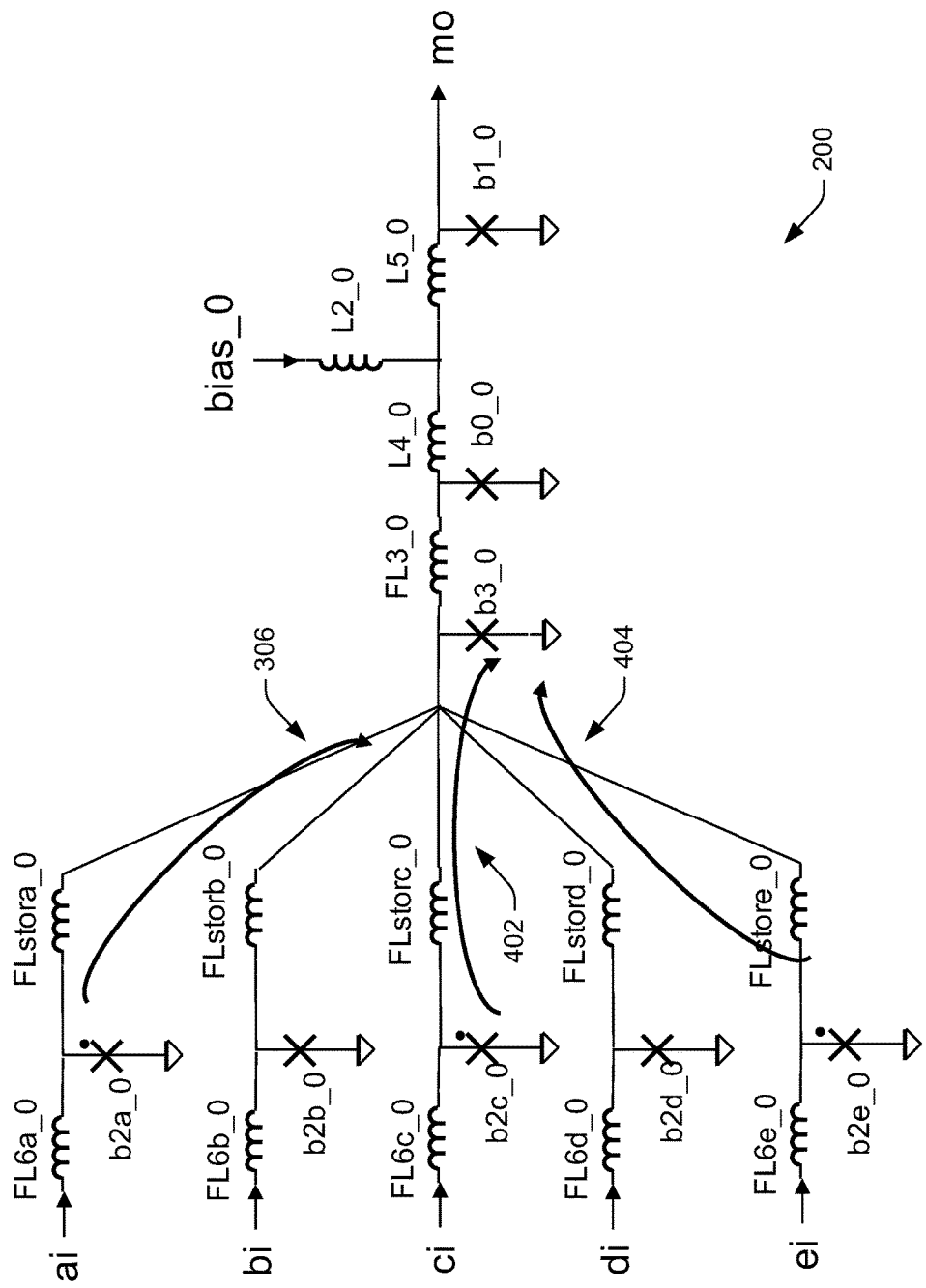
FIGS. 4A-4C illustrate an example majority input assertion sequence in the gate of FIG. 2.
Figure 4B:
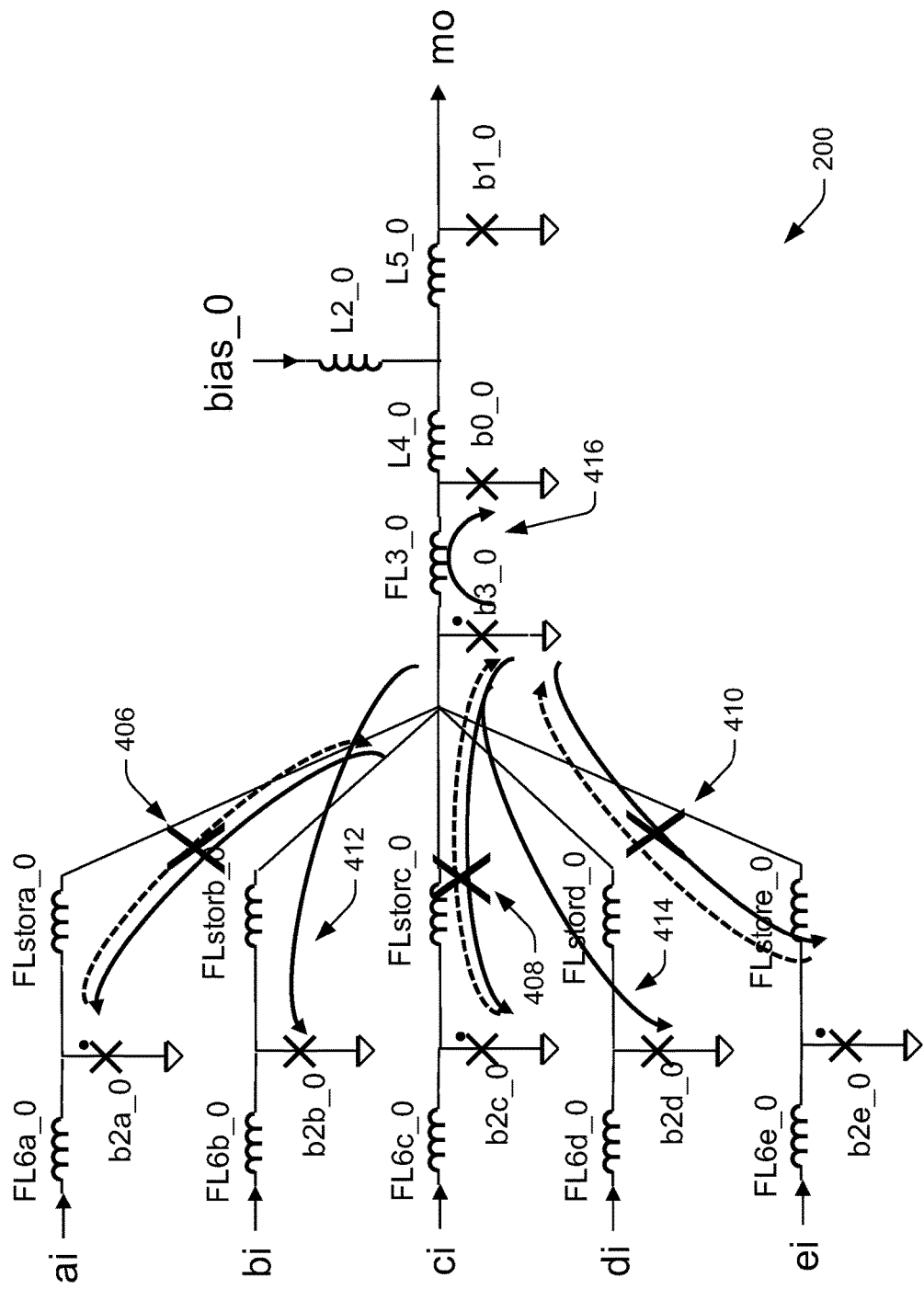
Figure 4C:
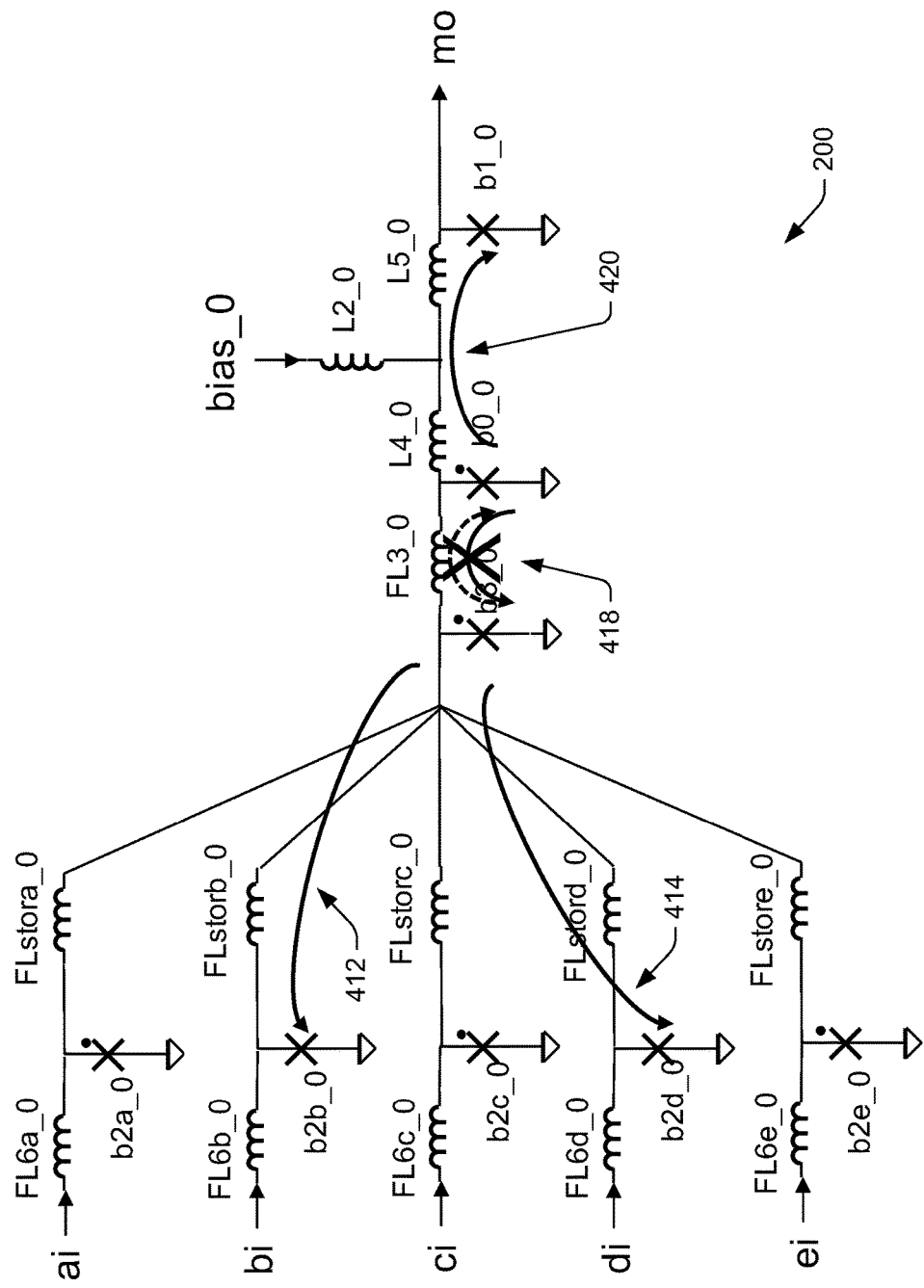

FIGS. 4A-4C illustrate the sequence of events in gate circuit 200 when a majority of the inputs are asserted. FIG. 4A shows the state of circuit 200 after three inputs, i.e., a majority of the five inputs ai through ei, have been asserted. In the illustrated example, inputs ai, ci, and ei have been asserted. Just as in FIG. 3B, current 306, associated with input ai, circulates in the storage loop formed by input JJ b2a_0, input loop storage inductor FLstora_0, and logical decision JJ b3_0. Additionally, currents 402 and 404, associated with inputs ci and ei, respectively, circulate in the respective loops formed by input JJ b2c_0, input loop storage inductor FLstorc_0, and logical decision JJ b3_0 for input ci, and input JJ b2e_0, input loop storage inductor FLstore_0, and logical decision JJ b3_0 for input ei. As indicated by dots above them, all three input JJs b2a_0, b2c_0, and b2e_0 are in the $2\pi$ state. A loop current like 306, 402, or 404, induced by a positive input pulse, will persist in its storage loop until a subsequent negative pulse on the respective input removes it, or until the clocking function of the AC component of bias signal bias_0 triggers logical decision JJ b3_0 to transform the inputs into an output. Because of this storage functionality, inputs needed to amount to a majority number of input assertions need not arrive within the same clock cycle.

All three of the input loop currents 306, 402, 404 bias logical decision JJ b3_0 towards a positive transition, but due to the size of input loop storage inductors FLstora_0, FLstorc_0, and FLstore_0, currents 306, 402, 404 are insufficient to cause this transition without additional bias current provided by the AC and DC bias bias_0. When the AC bias has reached sufficient positive magnitude, i.e., when gate 200 is positively "clocked," logical decision JJ b3_0 triggers, as indicated by the dot above it in FIG. 4B, which shows the result of this transition. The stored currents in input loop storage inductors FLstora_0, FLstorc_0, and FLstore_0 are annihilated 406, 408, 410. New currents 412, 414 are induced in the storage loops associated with inputs bi and di, but in the opposite direction. Additionally, current 416 is driven through inductor FL3_0 and JJ b0_0. This current, in combination with the AC bias, will trigger amplifying JJ b0_0 as shown in FIG. 4C. This triggering of amplifying JJ b0_0 will annihilate 418 the current in inductor FL3_0 and induce current 420 through inductors L4_0 and L5_0 and output JJ b1_0. Although not shown in FIG. 4C, current 420 will then trigger output JJ b1_0, propagating an output signal to the output mo of gate 200. Since all inputs are symmetric, this same series of events can happen with any combination of three or more asserted inputs to drive the output mo of gate 200 logical "high," giving the correct logical function for asserting the output of a 3-of-5 majority gate.

The induced current 412 in the bi input storage loop formed by input JJ b2b_0, input loop storage inductor FLstorb_0, and logical decision JJ b3_0, as well as the induced current 414 in the di input storage loop formed by input JJ b2d_0, input loop storage inductor FLstord_0, and logical decision JJ b3_0, biases logical decision JJ b3_0 towards a negative transition, but not sufficiently to cause the transition alone, even with the AC and DC bias bias_0. This puts circuit 200 in the correct state to perform the correct logical function for de-asserting the 3-of-5 majority gate. A single negative pulse arriving at any of the initially asserted inputs ai, ci, or ei will provide negatively biasing currents in three storage loops, such that in combination with the AC and DC bias they will unflip logical decision JJ b3_0 by causing it to transition out of its $2\pi$ phase, thereby de-asserting the output mo of gate 200 back to logical "low." This will occur when the AC bias has reached sufficient negative magnitude, i.e., on the negative portion of the AC bias component of bias signal bias_0. If, instead, a fourth positive input were to arrive on either of inputs bi or di, it would annihilate the respective stored negative current 412 or 414 and negative input pulses would be required at any two of the asserted inputs before de-asserting the output mo, again providing the correct function for a 3-of-5 majority gate.

Figure 5:
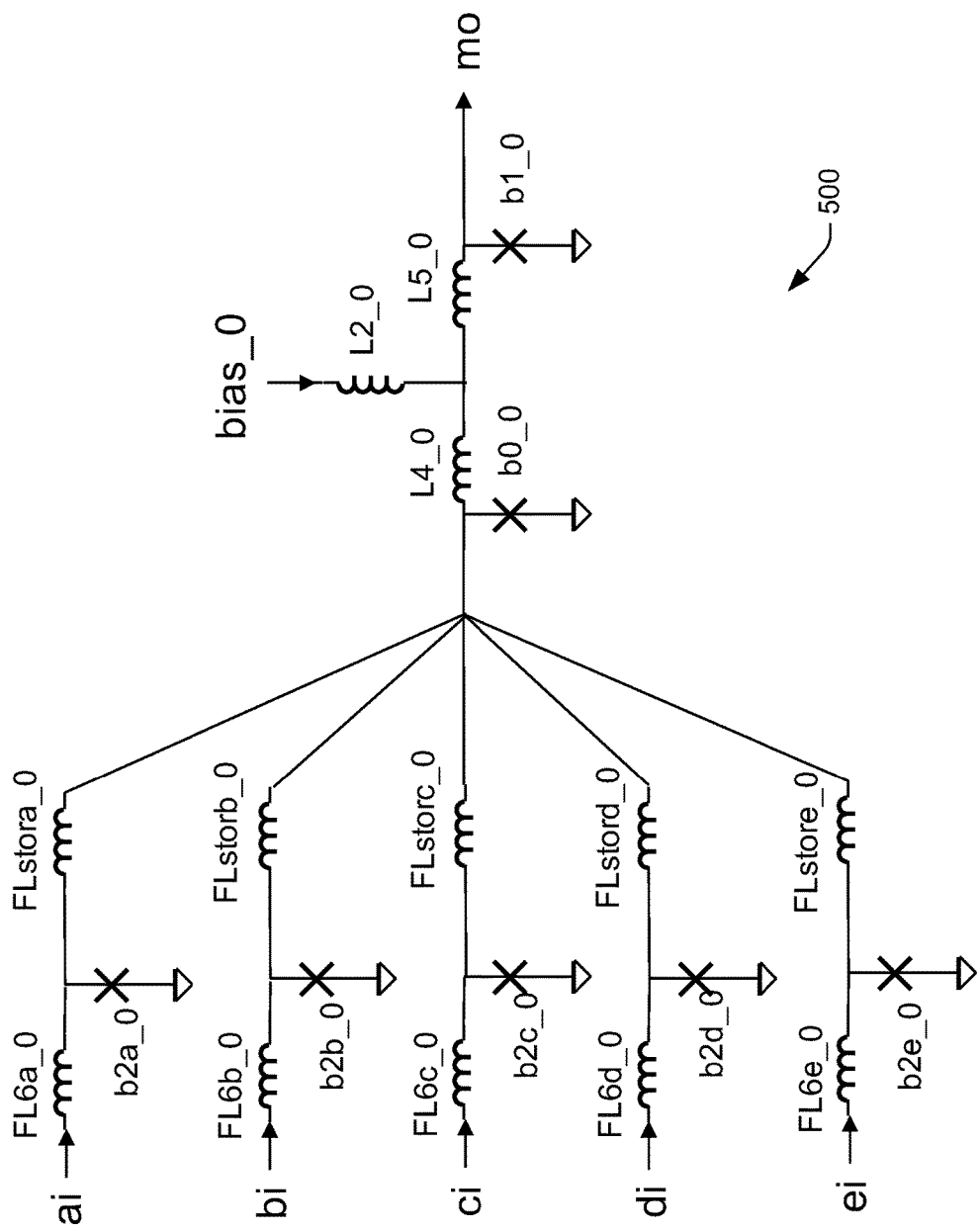
FIG. 5 is a circuit diagram of an example 3-of-5 majority gate.

As another example implementation, FIG. 5 shows gate 500 which is more similar to the 2-of-3 majority topology. The example of gate 500 eliminates JJ b3_0 and inductor FL3_0 of the previously described example gate 200. JJ b0_0 has been increased in size to about the sum of the b3_0 and b0_0 in gate 200. In example circuit 500, b0_0 serves as both the logical decision JJ and the first JJ of the output JTL stage of gate 500.

The illustrated topologies 200, 500 can be extended to larger majority gates, e.g., a 4-of-7 majority gate, a 5-of-9 majority gate, etc. Provided that the number of inputs is odd, the basic topologies 200, 500 can extend to an arbitrary number of inputs. However, as the number of inputs is increased, the operating margins decrease.

Gates 200 or 500 can also serve as the basis of several three-input logic gates. Grounding two of the inputs (effectively tying them to logical "low") creates a three-input AND gate with the remaining three inputs. Using a DC bias to induce one $\Phi_0$ (i.e., one SFQ pulse) of current on two of the inputs (effectively tying them to logical "high") creates a three-input OR gate from the remaining inputs. In both cases, these derivative gates can be optimized by removing the input JJ on the inputs that are held at a constant logical state and combining the inductors of these two inputs in parallel.

Figure 6:
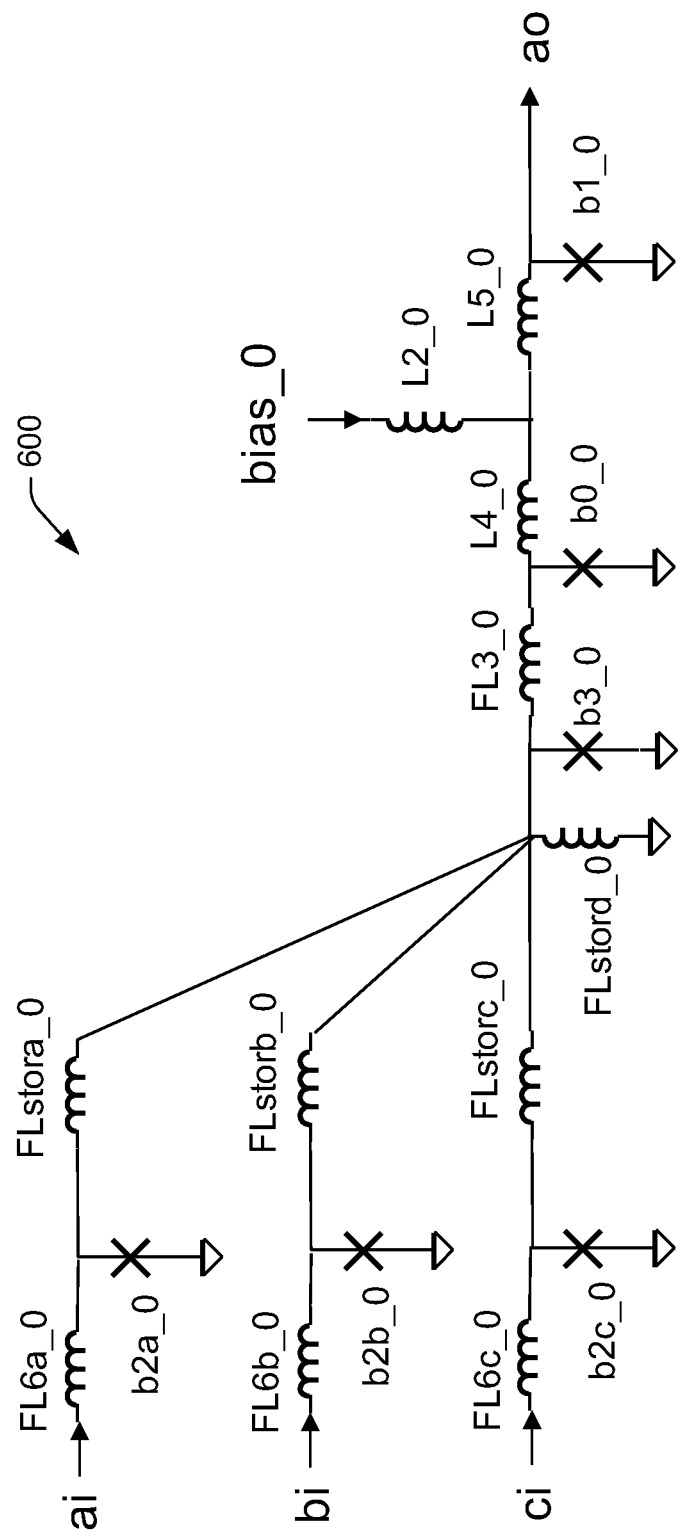
FIG. 6 is a circuit diagram of an example AND gate.

Following from the above description, FIG. 6 shows example AND gate 600, in which output ao is asserted if and only if all three of inputs ai, bi, and ci are asserted. In the illustrated configuration, substitute storage inductor FLstord_0 can be approximately half the size of FLstora_0, FLstorb_0, or FLstorc_0, in terms of its inductance value, because it substitutes for two storage inductors in parallel. Substitute storage inductor FLstord_0 may be somewhat larger than half the size of any of the other storage inductors to compensate for the eliminated parasitic input inductance of the input JJs b2d_0 and b2e_0 from the previous example gates 200, 500. For example, in gate 600, the inductance value of substitute storage inductor FLstord_0 can be between about 16 pH and 21 pH, e.g., 18 pH.

In AND gate 600 of FIG. 6, once logical decision JJ b3_0 triggers in response to asserted inputs ai, bi, and ci, positive currents in storage inductors FLstora_0, FLstorb_0, and FLstorc_0 are destroyed, a negative current is induced into substitute storage inductor FLstord_0, and a positive current is propagated along the output JTL stage and out of output ao. Thereafter, if any negative pulses are applied to de-assert any of logical inputs ai, bi, or ci, one or more negative currents stored in any of the storage loops associated with the logical inputs combines with the negative current stored in substitute storage inductor FLstord_0 to bias logical decision JJ b3_0 to untrigger upon the next negative portion of the AC component of the bias signal bias_0, which in turn propagates a negative pulse out of output ao.

Figure 7:
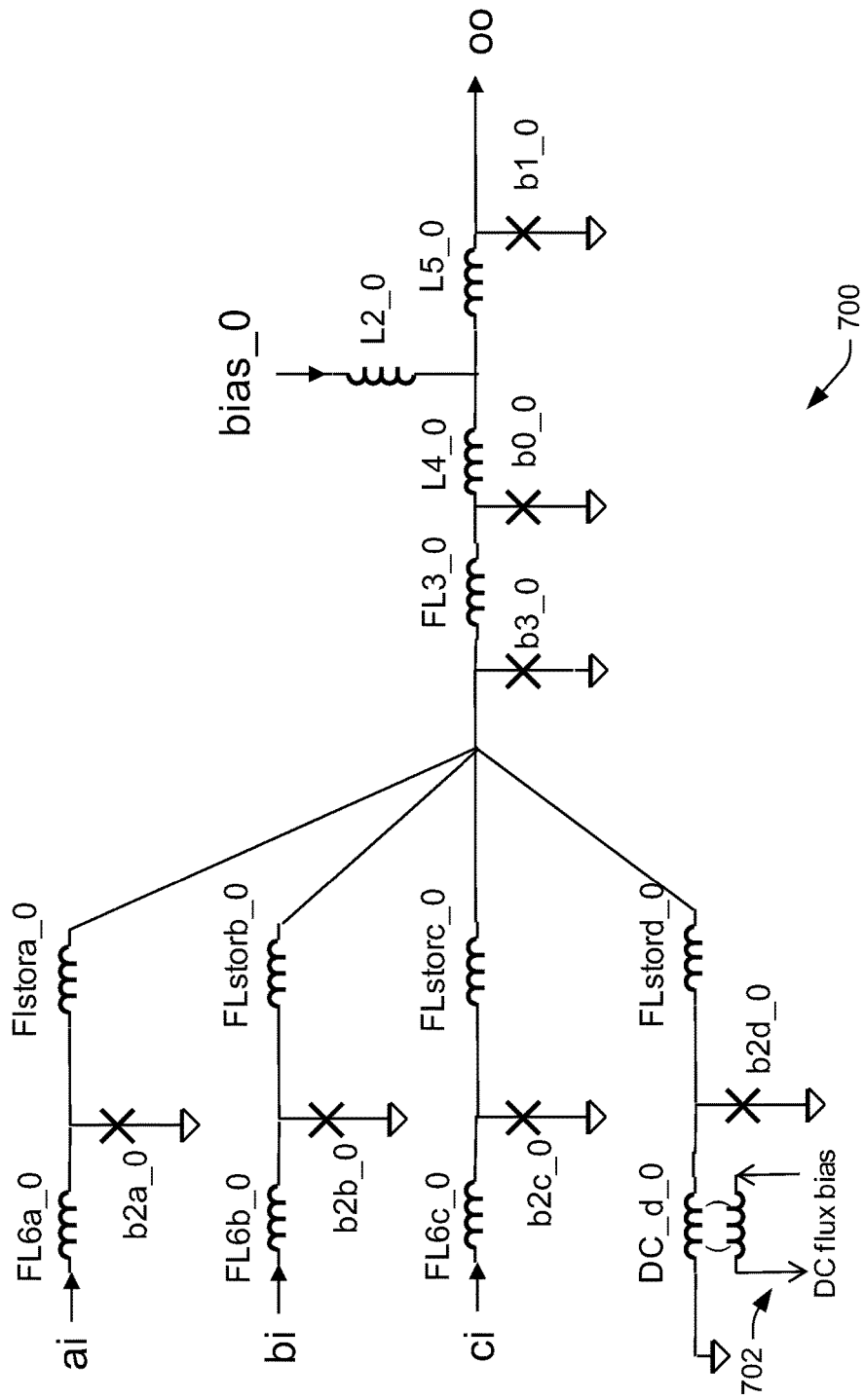
FIG. 7 is a circuit diagram of an example OR gate.

FIG. 7 shows example three-input OR gate 700, which is modified from the example majority gate 200 in a similar fashion to the three-input AND gate 600 of FIG. 6, but introduces an additional JJ, bias quantizing JJ b2d_0, between transformer-coupled input inductor DC_d_0 and substitute storage inductor FLstord_0. In OR gate 700, output oo is asserted if any one or more of the three inputs ai, bi, and ci is asserted. As in circuit 600, substitute storage inductor FLstord_0 is about half the size, or somewhat larger than half the size, of storage inductors FLstora_0, FLstorb_0, and FLstorc_0. Transformer-coupled input inductor DC_d_0 is transformer-coupled to DC flux bias line 702. Bias quantizing JJ b2d_0 quantizes the DC bias current supplied through DC bias DC_d_0 and improves operating margins. Bias quantizing JJ b2d_0 may be quite large, e.g., about twice the size of any of input JJs b2a_0, b2b_0, or b2c_0.

DC current provided through DC flux bias line 702 stays constant throughout system operation. At system start-up, the DC current through DC flux bias line 702 couples current into input inductor DC_d_0 to which it is transformer-coupled, via the AC transient that occurs at system power-up. This triggers bias quantizing JJ b2d_0 once at the beginning of operation, putting a positive current into substitute storage inductor FLstord_0, which, because of the component sizings, counts double toward the biasing of logical decision JJ b3_0 as compared to biasing from any of the logical inputs ai, bi, or ci.

Logical decision JJ b3_0 in OR gate 700 of FIG. 7 then effectively sees "two" out of "five" inputs asserted, the "two" asserted inputs being the non-logical, phantom "inputs" initiated by the DC bias, and triggers in response to at least one asserted input among logical inputs ai, bi, and ci. Upon such triggering, the positive current in substitute storage inductor FLstord_0 is destroyed, b2d_0 does not untrigger, positive currents in storage inductors FLstora_0, FLstorb_0, or FLstorc_0 are destroyed should the inputs associated with those storage inductors have been asserted, negative currents are induced in the storage inductors associated with any unasserted inputs, and a positive current is propagated along the output JTL stage and out of output oo.

Thereafter, if negative pulses are applied to de-assert all of previously asserted inputs among logical inputs ai, bi, or ci, the negative currents stored in the storage loops associated with the logical inputs combine to bias logical decision JJ b3_0 to untrigger upon the next negative portion of the AC component of the bias signal bias_0, which in turn propagates a negative pulse out of output oo. This untriggering of logical decision JJ b3_0 restores the positive current to substitute storage inductor FLstord_0, bringing the circuit back to its initial state, i.e., the state following start-up injection of initial positive current into substitute storage inductor FLstord_0 via DC flux bias line 702.

Figure 8:
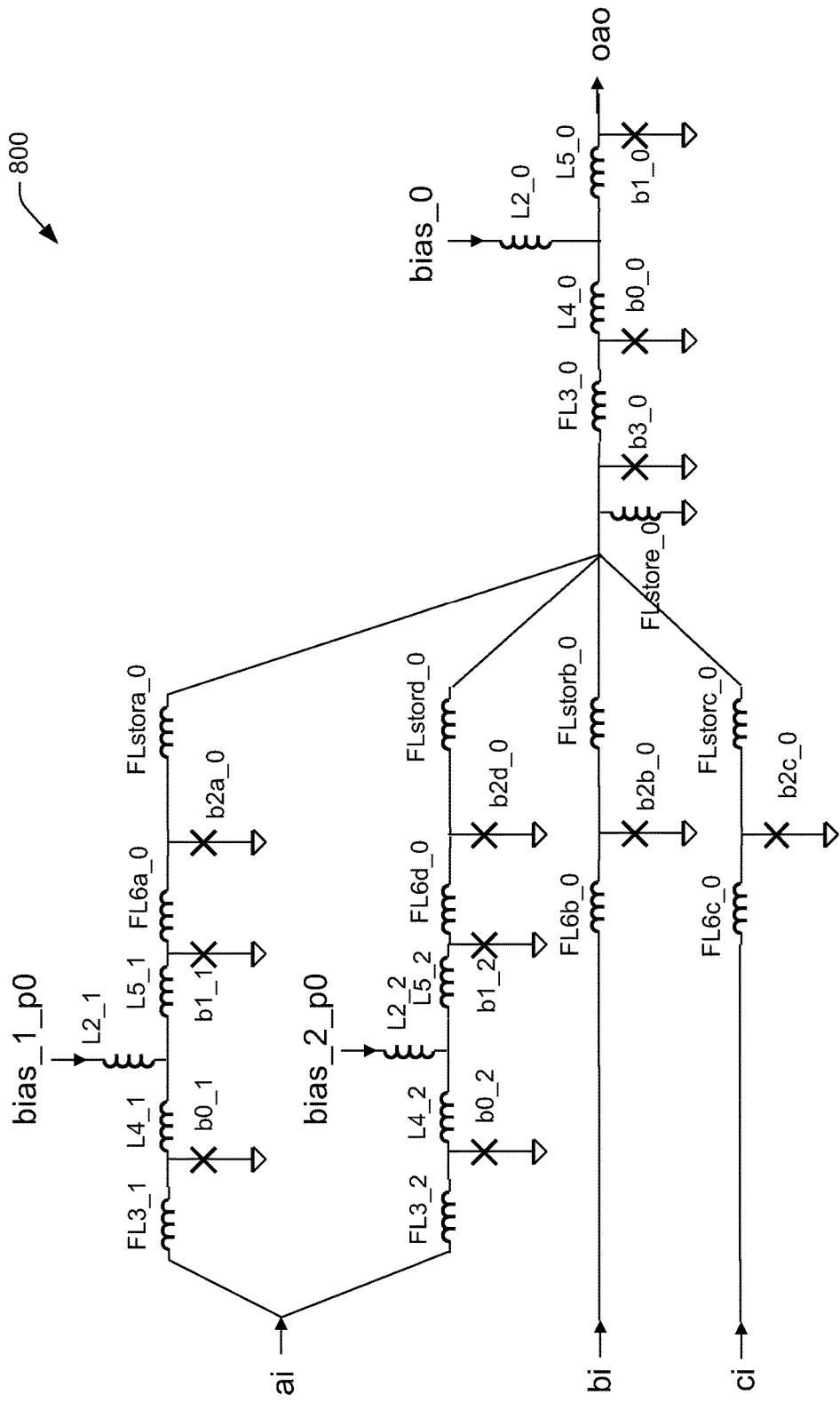
FIG. 8 is a circuit diagram of an example OA gate.

FIG. 8 shows an example OR-AND (OA) gate, and more specifically a three-input OA21 gate 800, constructed based on the previously described topologies. Conceptually, an OA gate is an AND gate having at least one of its inputs provided by the output of an OR gate. An OA gate thus provides an asserted output only when all of the inputs to its conceptual AND stage are asserted, in turn requiring that that at least one of the inputs to its at least one conceptual OR stage is asserted. An OA21 gate is an OA gate having two inputs to its conceptual OR stage and, in addition to the output of its conceptual OR stage, one other input to its conceptual AND stage. Thus, an OA21 gate provides an asserted output only when a first logical input is asserted and at least one of the remaining two logical inputs is asserted.

The function of OA21 gate 800 in FIG. 8 is described by the Boolean equation oao=ai AND (bi OR ci). To accomplish this function, input ai can be placed into two storage loops that branch from single input ai, whereas bi and ci are each connected to one storage loop. In similar fashion to the input elimination illustrated by the previous example gate 600 shown in FIG. 6, an eliminated fifth input is replaced by substitute storage inductor FLstore_0. In gate 800, however, substitute storage inductor FLstore_0 can be about the same size as the other storage inductors FLstora_0, FLstorb_0, FLstorc_0, and FLstord_0, as opposed to being half the size, as substitute storage inductor FLstord_0 is in AND gate 600 in FIG. 6.

Connecting input ai directly to storage inductors FL6a_0 and FL6d_0 could present too large a load for a single driving JTL of normal size to handle, so input ai includes additional JTLs, connected to bias signal lines bias_1_p0 and bias_2_p0, respectively, to provide the required amplification. As examples, in gate 800 of FIG. 8, storage loop input inductors FL6a_0 and FL6d_0 can have inductance values between about 8 pH and 9 pH (e.g., 8.5 pH), JTL input inductors FL3_1 and FL3_2 can have inductance values of between about 20 pH and 21 pH (e.g., 20.5 pH), the values of inductors L4_1 plus L5_1, as well as L4_2 plus L5_2, can be chosen to sum to between about 14 pH and 15 pH (e.g., 14.5 pH), and bias inductors L2_1 and L2_2 can be sized to be slightly smaller than they would be in a standard JTL to provide extra power to JJs b1_1 and b1_2, enabling them to drive the heavy load of input ai of gate 800. The bias signals provided on lines bias_1_p0 and bias_2_p0 can have the same phase as the bias signal from line bias_0, but this is not strictly necessary for the circuit to function. In an example similar to gate 800 that is not illustrated, the two paths attached to input ai in parallel may be combined by doubling all the JJ sizes and halving all the inductor sizes.

FIG. 9 illustrates an example method 900 of determining a logical majority value based on SFQ pulse inputs. Positive SFQ pulses are provided 902 to assert a majority of the logical inputs of an RQL majority gate to place 904 currents in a majority of input storage loops. The RQL majority gate can be, for example, like gates 200 or 500 shown in FIGS. 2 and 5, or can be extensions of such examples that provide a greater odd number of inputs, as described above. Thus, for example, the RQL majority gate used in the method may comprise no more than eight JJs and no more than fourteen inductors, as shown in FIG. 2. For example, the RQL majority gate used in the method may comprise no more than seven JJs and no more than thirteen inductors, as shown in FIG. 5. A JJ that is configured to trigger only when a majority of the logical inputs are asserted then triggers 906. The JJ can be so configured, for example, by making it common to a plurality (e.g., all) of the input storage loops, by providing appropriate biasing, and/or by appropriate component sizing. An assertion signal, generated as a result of the triggering, then propagates 908 from an output of the RQL majority gate. The assertion signal can be, for example, a single SFQ pulse.

FIG. 10 illustrates an example method 1000 of determining a logical AND value based on more than two SFQ pulse inputs. Positive SFQ pulses are provided 1002 to assert all of the logical inputs of an RQL AND gate having more than two logical inputs to place 1004 currents in input storage loops associated with the asserted inputs, e.g., one loop per input. The RQL AND gate can be, for example, like gate 600 shown in FIG. 6, or can be extensions of such example providing a greater number of inputs. Thus, for example, the RQL AND gate used in the method may comprise no more than six JJs and no more than eleven inductors, as shown in FIG. 6. A JJ that is configured to trigger only when all of the logical inputs are asserted then triggers 1006. The JJ can be so configured, for example, by making it common to all of the input storage loops, by effectively tying to logical "low" additional inputs not counted among the logical inputs, by providing appropriate biasing, and/or by appropriate component sizing. An assertion signal, generated as a result of the triggering, then propagates 1008 from an output of the RQL AND gate. The assertion signal can be, for example, a single SFQ pulse.

Figures 11, 12:
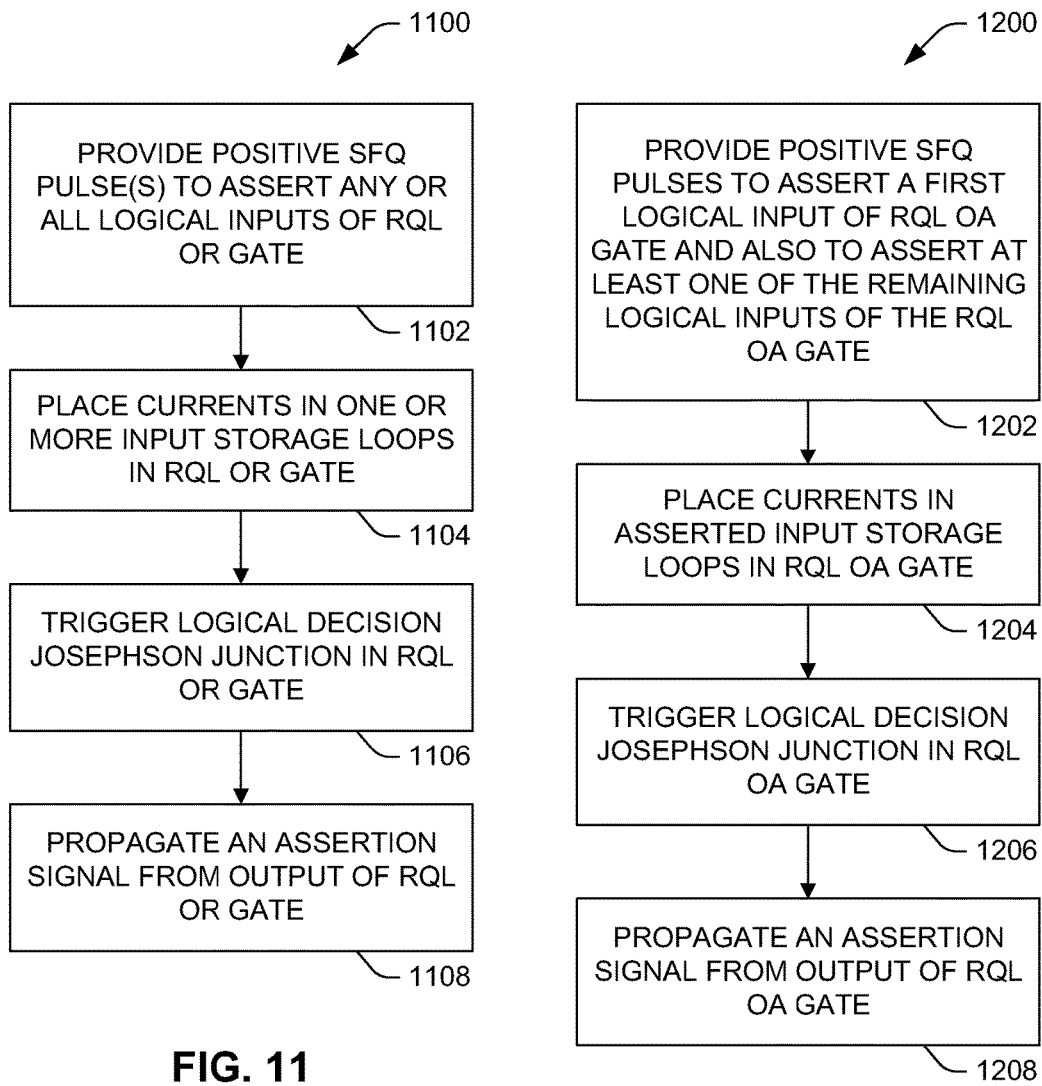
FIG. 11 is a flow diagram of an example method of determining a logical OR value based on SFQ pulse inputs.
FIG. 12 is a flow diagram of an example method of determining a logical OA value based on SFQ pulse inputs.

FIG. 11 illustrates an example method 1100 of determining a logical OR value based on more than two SFQ pulse inputs. Positive SFQ pulses are provided 1102 to assert any or all of the logical inputs of an RQL OR gate having more than two logical inputs to place 1104 currents in one or more input storage loops associated with the asserted inputs, e.g., one loop per input. The RQL OR gate can be, for example, like gate 700 shown in FIG. 7, or can be extensions of such example providing a greater number of inputs. A JJ that is configured to trigger when any of the logical inputs is asserted then triggers 1106. The JJ can be so configured, for example, by making it common to all of the input storage loops, by effectively tying to logical "high" additional inputs not counted among the logical inputs, by providing appropriate biasing, and/or by appropriate component sizing. An assertion signal, generated as a result of the triggering, then propagates 1108 from an output of the RQL OR gate. The assertion signal can be, for example, a single SFQ pulse.

FIG. 12 illustrates an example method 1200 of determining a logical OA value based on more than two SFQ pulse inputs. Positive SFQ pulses are provided 1202 to assert a first of the logical inputs of an RQL OA gate having more than two logical inputs, and also to assert at least one of the remaining logical inputs of the RQL OA gate, thereby placing 1204 currents in input storage loops associated with the asserted inputs, e.g., at least one loop per input. The RQL OA gate can be, for example, OA21 gate 800 shown in FIG. 8, or can be extensions of such example providing a greater number of inputs, and/or combining the two branches of input ai as a single branch. The first of the logical inputs may have two or more input storage loops associated with it, or may have one storage loop built with components having values sized respectively to the components of the loops of the remaining inputs. For example, when the first of the logical inputs has two or more storage loops associated with it, the storage loops can be preceded by additional JTL stages to provide amplification. In other examples, when the first of the logical inputs has only one storage loop associated with it, the JJs of the one storage loop can be about double the value of the JJs in the storage loops associated with the remaining inputs, and the inductors of the one storage loop can be about half the inductance value of the JJs in the storage loops associated with the remaining inputs. A JJ that is configured to trigger when any of the logical inputs is asserted then triggers 1206. The JJ can be so configured, for example, by making it common to all of the input storage loops, by effectively tying to logical "low" additional inputs not counted among the logical inputs, by providing appropriate biasing, and/or by appropriate component sizing. An assertion signal, generated as a result of the triggering, then propagates 1208 from an output of the RQL OA gate. The assertion signal can be, for example, a single SFQ pulse.

Methods 900, 1000, 1100, and 1200 are generalized as a method 1300 of determining a logical output from an RQL gate having more than two logical inputs based on SFQ pulse inputs shown in FIG. 13A. Positive SFQ pulses are provided 1302 to assert one or more logical inputs of an RQL gate having more than two logical inputs to place 1304 one or more currents in one or more input storage loops associated with the asserted inputs, e.g., one loop per input, where the gate has more than two such storage loops. The RQL gate can be, for example, like any of gates 100, 200, 500, 600, 700, or 800, shown in FIG. 1, 2, 5, 6, 7, or 8, respectively, or can be extensions of such example providing a greater number of inputs and/or combining or splitting input storage loop branches. A JJ that is configured to trigger based on the assertion of a certain number or certain ones of the logical inputs then triggers 1306. The JJ can be so configured, for example, by making it common to all of the input storage loops, by effectively tying to logical "high" or logical "low" additional inputs not counted among the logical inputs, by providing appropriate biasing, and/or by appropriate component sizing. An assertion signal, generated as a result of the triggering, then propagates 1308 from an output of the RQL gate. The assertion signal can be, for example, a single SFQ pulse.

FIG. 13B shows method 1350 of determining a logical output from an RQL gate having more than two logical inputs based on SFQ pulse inputs, which can continue from method 1300 shown in FIG. 13A. Negative SFQ pulses are provided 1310 to de-assert one or more logical inputs of an RQL gate having more than two logical inputs to place 1312 one or more currents in one or more input storage loops associated with the asserted inputs, e.g., one loop per input, where the gate has more than two such storage loops. The placed currents can be negative currents, i.e., currents equal and opposite to the currents placed 1304 in method 1300. Again, the RQL gate can be, for example, like any of gates 100, 200, 500, 600, 700, or 800, shown in FIG. 1, 2, 5, 6, 7, or 8, respectively, or can be extensions of such example providing a greater number of inputs and/or combining or splitting input storage loop branches. A JJ that is configured to untrigger based on the de-assertion of a certain number or certain ones of the logical inputs then untriggers 1314. The JJ can be so configured, for example, by making it common to all of the input storage loops, by effectively tying to logical "high" or logical "low" additional inputs not counted among the logical inputs, by providing appropriate biasing, and/or by appropriate component sizing. A de-assertion signal, generated as a result of the triggering, then propagates 1316 from an output of the RQL gate. The assertion signal can be, for example, a single SFQ pulse, e.g., a single negative SFQ pulse, opposite in direction to the pulse propagated 1308 in method 1300.

The use of logic gates with more than two inputs, including the examples disclosed herein, can improve the efficiency and density of RQL logic. While logic functions having more than two inputs can be built from two-input gates, the large number of such gates required to construct three-or-more-input gates can impact efficiency. Gates that can implement larger logic functions allow reduced die sizes and, by extension, reduced cost per die. The logic gates described herein can operate according to RQL data encoding, where, for example, it would be impermissible for a logic gate to propagate two positive output pulses in a row or two negative output pulses in a row.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) gate circuit comprising:
    an input stage having more than two logical inputs each configured to be asserted based on receiving a positive single flux quantum (SFQ) pulse, the input stage comprising, for each logical input, at least one storage loop associated with the logical input, each storage loop comprising at least one input Josephson junction (JJ), at least one inductor, and a logical decision JJ, the logical decision JJ being common to all the storage loops associated with the logical inputs; and
    an output stage configured to assert an output based on a triggering of the logical decision JJ in response to a combination of logical inputs.

2. The circuit of claim 1, wherein each storage loop associated with a logical input in the input stage is configured to store a superconducting current based on the assertion of the storage loop's associated input.

3. The circuit of claim 1, wherein the output stage further comprises a bias input configured to induce a bias current in the logical decision JJ based on a bias signal to set a threshold of the input stage.

4. The circuit of claim 3, wherein the bias signal is an AC and DC bias signal.

5. The circuit of claim 1, wherein the output stage is further configured to de-assert the output based on the untriggering of the logical decision JJ in response to a different combination of logical inputs.

6. The circuit of claim 1, wherein the input stage has exactly five logical inputs, and the output stage is configured to assert the output based on assertion of at least three of the logical inputs.

7. The circuit of claim 6, wherein the output stage includes no more than one JJ, exclusive of the logical decision JJ.

8. The circuit of claim 1, wherein the input and output stages are configured to assert the output based on assertion of all of the logical inputs and de-assert the output based on de-assertion of any one of the asserted logical inputs.

9. The circuit of claim 8, wherein the input stage has exactly three logical inputs.

10. The circuit of claim 1, wherein the input and output stages are configured to assert the output based on assertion of any one of the logical inputs and de-assert the output based on de-assertion of all asserted logical inputs.

11. The circuit of claim 10, wherein the input stage has exactly three logical inputs.

12. The circuit of claim 1,
wherein the logical inputs consist of a first logical input and remaining logical inputs, and
wherein the input and output stages are configured to assert the output based on:
assertion of the first logical input, and
assertion of at least one of the remaining logical inputs;
and wherein the input and output stages are configured to de-assert the output based on:
de-assertion of the asserted first logical input, or
de-assertion of all of the asserted remaining logical inputs.

13. The circuit of claim 12, wherein the input stage has exactly three logical inputs.

14. A method of determining a logic value comprising:
providing one or more positive single flux quantum (SFQ) pulses to assert one or more logical inputs of a reciprocal quantum logic (RQL) gate having more than two logical inputs;
based on the providing, placing one or more positive currents in one or input storage loops in the RQL gate, wherein the RQL gate has at least one storage loop per logical input;
based on the placing, triggering a logical decision Josephson junction (JJ) in the RQL gate in response to a combination of logical inputs; and
based on the triggering, propagating an assertion signal from an output of the RQL gate.

15. The method of claim 14, further comprising, after the propagating:
providing one or more negative SFQ pulses to de-assert one or more of the logical inputs;
based on the providing the one or more negative SFQ pulses, placing one or more negative currents in one or more of the input storage loops;
based on the placing the one or more negative currents, untriggering the logical decision JJ in response to a different combination of logical inputs; and
based on the untriggering, propagating a de-assertion signal from the output of the RQL gate.

16. The method of claim 14, further comprising providing a bias signal having an AC component as a clock signal, and wherein the triggering is further based on the clock signal.

17. A circuit comprising:
more than two logical input Josephson transmission lines (JTLs) intersecting at a dovetail node, each logical input JTL comprising a storage loop input inductor connected, at a first node, to an input Josephson junction (JJ) and a storage inductor, the storage loop input inductor, input JJ, and storage inductor being sized to provide unidirectional data flow;
a logical decision JJ connected between the dovetail node and a low-voltage node, such that respective storage loops are formed by the input JJ and storage inductor of each input JTL and the logical decision JJ; and
an output JTL between the dovetail node and a logical output node,
wherein the circuit is configured to provide an asserted or de-asserted logical output signal at the output node based on asserted or de-asserted logical input signals provided to the logical input JTLs.

18. The circuit of claim 17, further comprising an AC and DC bias line provided to the output JTL.

19. The circuit of claim 17 having three logical input JTLs, wherein the logical output signal provides one of OR, AND, or OR-AND logical determinations based on the logical input signals.

20. The circuit of claim 17 having five or more logical input JTLs, wherein the logical output signal provides a logical majority determination based on the logical input signals.

* * * * *